United States Patent
Hsu et al.

(10) Patent No.: US 8,466,519 B2
(45) Date of Patent: Jun. 18, 2013

(54) READ-ONLY MEMORY DEVICE WITH CONTACTS FORMED THEREIN

(75) Inventors: Ching-Hsiang Hsu, Hsin-Chu (TW); Ching-Sung Yang, Hsinchu (TW); Shih-Jye Shen, Hsin-Chu (TW)

(73) Assignee: eMemory Technology Inc., Hsinchu Science Park, Hsin-Chu (TW)

( * ) Notice: Subject to any disclaimer, the term of this patent is extended or adjusted under 35 U.S.C. 154(b) by 940 days.

(21) Appl. No.: 12/536,506

(22) Filed: Aug. 6, 2009

(65) Prior Publication Data

US 2011/0031560 A1 Feb. 10, 2011

(51) Int. Cl.
*H01L 27/112* (2006.01)
*H01L 21/336* (2006.01)

(52) U.S. Cl.
USPC ............... 257/390; 257/391; 257/E21.409; 257/E27.102

(58) Field of Classification Search
USPC ................... 257/390, 391, E21.409, E27.102
See application file for complete search history.

(56) References Cited

U.S. PATENT DOCUMENTS 6,642,587 B1 * 11/2003 Poplevine et al. ............ 257/390

FOREIGN PATENT DOCUMENTS

| TW | 200629574 | 8/2006 |
| TW | I263343 | 10/2006 |
| TW | 200701236 | 1/2007 |

* cited by examiner

*Primary Examiner* — Lynne Gurley
*Assistant Examiner* — Vernon P Webb
(74) *Attorney, Agent, or Firm* — Winston Hsu; Scott Margo

(57) ABSTRACT

A mask-defined read-only memory array is formed on a substrate, and includes a first ROM bit and a second ROM bit of opposite polarities. The first ROM bit has a first MOS transistor and a first block layer formed over a first region of the substrate. A second source/drain region of the first MOS transistor and a first diffusion region are formed in a first region of the substrate on opposite sides of the first block layer. The second ROM bit includes a second MOS transistor.

17 Claims, 18 Drawing Sheets

READ-ONLY MEMORY DEVICE WITH CONTACTS FORMED THEREIN

BACKGROUND OF THE INVENTION

1. Field of the Invention

The present invention relates to a semiconductor memory device. More particularly, the present invention relates to a semiconductor read-only memory (ROM) and a method of manufacture thereof. The present invention further provides a method of directly transforming CMOS-compatible single-poly one-time programming (OTP) memory into coded non-volatile memory without the need for redesigning the peripheral circuitry.

2. Description of the Prior Art

In the strictest sense, read-only memory (ROM), as its name implies, is a data storage medium that cannot be written to (or erased), but only read from. Today, ROM may even refer more broadly to any data storage medium that is not randomly accessible. In most modern applications ROM is utilized for storage of program code that should not be changed frequently, or for storage of data, such as music, video, or other files that may be written once and read many times. In practice, ROM may be programmed with data during fabrication, or may be written to electronically. Thus, ROM technology may be roughly divided into mask-programmable ROM (MPROM) and electrically-programmable ROM (EPROM).

MPROM technologies may be further take form in at least three categories, including diffusion ROM, $V_{TH}$ ROM, and via ROM. Please refer to FIG. 1, which is a diagram of eight ROM bits defined through active area (AA) regions or lack thereof. As shown in FIG. 1, polysilicon may be utilized to form word lines W0-W3, and a metal layer may be utilized to form bit lines B0-B1 over diffusion regions. Contacts C0-C3 may be formed to electrically connect the bit lines B0-B1 with the diffusion regions. During fabrication, diffusion may be allowed or blocked through use of a mask. Thus, by defining block regions BR0-BR2 in the mask, diffusion may be prevented at intersections I02, I10, I12 corresponding to the bit line BL0 and the word line WL2, the bit line BL1 and the word line WL0, and the bit line BL1 and the word line WL2, respectively. As shown in FIG. 1, two diffusion regions DR0, DR1 are formed in the substrate due to use of the block regions BR0-BR2. In the example shown in FIG. 1, bit polarity of transistors formed at intersections I00, I01, I03, I11, I13 is "1", whereas bit polarity at the intersections I02, I10, I12 is "0", as no transistors are formed.

Please refer to FIG. 2, which is a diagram of eight ROM bits defined through high/low $V_{TH}$ transistors. Similar to FIG. 1, polysilicon may be utilized to form word lines W0-W3, and a metal layer may be utilized to form bit lines B0-B1 over a diffusion region DR. Contacts C0-C3 may be formed to electrically connect the bitlines B0-B1 with the diffusion region DR. During fabrication, definition of high $V_{TH}$ transistors may be accomplished through use of an extra mask. Thus, by defining high $V_{TH}$ regions HVR0-HVR2 in the mask, transistors at intersections I02, I10, I12 corresponding to the bit line BL0 and the word line WL2, the bit line BL1 and the word line WL0, and the bit line BL1 and the word line WL2, respectively, may have relatively high threshold voltage ($V_{TH}$). In the example shown in FIG. 2, bit polarity of transistors formed at intersections I00, I01, I03, I11, I13 is "1", whereas bit polarity at the intersections I02, I10, I12 is "0".

Please refer to FIG. 3, which is a diagram of eight ROM bits defined through use of vias (contacts) Similar to FIG. 1, polysilicon may be utilized to form word lines W0-W3, and a metal layer may be utilized to form bit lines B0-B1 over diffusion regions DR0, DR1, DR3. Contacts C0-C4 may be formed to electrically connect the bit lines B0-B1 with the diffusion regions DR0, DR1, DR3. During fabrication, ROM code maybe defined through use of the contacts C0-C4. Thus, by placing contacts C0-C4, transistors are formed at intersections I00, I01, I03, I11, I13 corresponding to the bit line BL0 and the word lines WL0, WL1, WL3, and to the bit line BL1 and the word lines WL1, WL3, respectively. In the example shown in FIG. 3, bit polarity of transistors formed at intersections I00, I01, I03, I11, I13 is "1", whereas bit polarity at the intersections I02, I10, I12 is "0".

Please refer to FIG. 4A and FIG. 4B, which are diagrams of an EPROM bit. FIG. 4A shows a top view of layout of the EPROM bit; FIG. 4B shows a cutaway view of the EPROM bit along line A-A of FIG. 4A. The EPROM bit comprises a bit line BL0, a word line WL0, a first contact C0, an a second contact C1. The first contact C0 is formed on a first diffusion region DR0; the second contact C1 is formed on a third diffusion region DR2. The word line WL0 may be formed of polysilicon, and the bit line BL0 may be formed of metal electrically connected to the first diffusion region DR0 and the third diffusion region DR2 through the first contact C0 and the second contact C1, respectively. The EPROM bit further comprises a floating polysilicon layer FPL0 utilized for programming the EPROM bit. As shown in FIG. 4B, the EPROM bit may be programmed by introducing charges into the floating polysilicon layer FPL0. Thus, channel formation may be induced between a second diffusion region DR1 and the third diffusion region DR2. If no charges are introduced into the floating polysilicon layer FPL0, no channel formation is induced between the second diffusion region DR1 and the third diffusion region DR2. In this way, distinction may be made between "1" and "0" polarities at each EPROM bit.

Please refer to FIG. 5A and FIG. 5B, which are diagrams of a second type of EPROM bit. FIG. 5A shows a top view of layout of the EPROM bit; FIG. 5B shows a cutaway view of the EPROM bit along line B-B of FIG. 5A. Similar to the EPROM bit shown in FIG. 4A and FIG. 4B, the EPROM bit of FIG. 5A and FIG. 5B includes a bit line BL0, a word line WL0, a first contact C0, an a second contact Cl. The first contact C0 is formed on a first diffusion region DR0; the second contact C1 is formed on a third diffusion region DR2. The word line WL0 may be formed of polysilicon, and the bit line BL0 may be formed of metal electrically connected to the first diffusion region DR0 and the third diffusion region DR2 through the first contact C0 and the second contact C1, respectively. Unlike the EPROM bit of FIG. 4A and FIG. 4B, the EPROM bit of FIG. 5A and FIG. 5B includes an ONO (oxide-nitride-oxide) dielectric layer ONO0 between a polysilicon layer PL0 and a substrate on which the EPROM bit is formed. The ONO dielectric layer ONO0 may act as a charge-trapping layer. Thus, presence or absence of charges in the ONO dielectric layer ONO0 may be utilized for distinguishing bit polarity of the EPROM bit shown in FIG. 5A and FIG. 5B, as charges in the ONO dielectric layer ONO0 induce channel formation between a second diffusion region DR1 and the third diffusion region DR2.

Please refer to FIG. 6A and FIG. 6B, which are diagrams of a third type of EPROM bit typically utilized in flash memory applications. FIG. 6A shows a top view of layout of the EPROM bit; FIG. 6B shows a cutaway view of the EPROM bit along line C-C of FIG. 6A. Similar to the EPROM bit shown in FIG. 5A and FIG. 5B, the EPROM bit of FIG. 6A and FIG. 6B includes an ONO dielectric layer ONO1. However, the ONO dielectric layer ONO1 is formed between a polysilicon layer of the word line WL0 and a polysilicon layer PL0 formed between the word line WL0 and the substrate. Thus, the ONO dielectric layer ONO1 acts as an inter-polysilicon dielectric layer. A first contact C0 is formed on a first diffusion region DR0; a second contact C1 is formed on a second diffusion region DR1. The bit line BL0 may be formed of metal electrically connected to the first diffusion region DR0 and the third diffusion region DR2 through the first contact C0 and the second contact C1, respectively. To program the EPROM bit, charges may be introduced into the polysilicon layer PL0. Thus, bit polarity of the EPROM bit may be distinguished based on induction, or lack thereof, of a channel between the first diffusion region DR0 and the second diffusion region DR1.

The methods described above and shown in FIG. 1, FIG. 2, and FIG. 3 have a number of disadvantages. For example, peripheral circuitry may need to be redesigned, product development may be long and costly, yield is low, and required test time is long. Further, no simple method exists for transforming the EPROM topologies shown in FIG. 4A, FIG. 4B, FIG. 5A, FIG. 5B, FIG. 6A, and FIG. 6B into mask programmable memory without changing the fabrication process utilized for forming the EPROM bits.

SUMMARY OF THE INVENTION

According to a first embodiment of the present invention, a mask-defined read-only memory array formed on a substrate comprises a first ROM bit and a second ROM bit of opposite polarities. The first ROM bit includes a first block layer formed over a first region of the substrate, and a first metal-oxide-silicon (MOS) transistor. The first MOS transistor includes a first source/drain diffusion region formed outside the first region of the substrate on a first side of the first block layer, a second source/drain diffusion region formed in the first region of the substrate, and a first gate layer electrically connected to a first word line for inducing a channel between the first source/drain diffusion region and the second source drain diffusion region. A first contact is electrically connected to the first source/drain diffusion region for receiving a first select signal. A first diffusion region is formed in the first region of the substrate on a second side of the first block layer different from the first side of the first block layer. A second contact is electrically connected to the first diffusion region for receiving a second select signal. The second ROM bit includes a second metal-oxide-silicon (MOS) transistor comprising a third source/drain diffusion region, a fourth source/drain diffusion region, and a second gate layer formed between the third source/drain diffusion region and the fourth source/drain diffusion region, the second gate layer electrically connected to a second word line for inducing a channel between the third source/drain diffusion region and the fourth source drain diffusion region. A third contact is electrically connected to the third source/drain diffusion region for receiving a third select signal, and a fourth contact is electrically connected to the fourth source/drain diffusion region for receiving a fourth select signal.

According to a second embodiment of the present invention, a mask-defined read-only memory array formed on a substrate comprises a first ROM bit and a second ROM bit of opposite polarities. The first ROM bit includes a first block layer formed over a first region of the substrate, and a first metal-oxide-silicon (MOS) transistor. The first MOS transistor includes a first source/drain diffusion region formed outside the first region of the substrate on a first side of the first block layer, a second source/drain diffusion region formed in the first region of the substrate, and a first gate layer electrically connected to a first word line for inducing a channel between the first source/drain diffusion region and the second source drain diffusion region. A first contact is electrically connected to the first source/drain diffusion region for receiving a first select signal. A first diffusion region is formed in the first region of the substrate on a second side of the first block layer different from the first side of the first block layer. A second contact is electrically connected to the first diffusion region for receiving a second select signal. The second ROM bit includes a second metal-oxide-silicon (MOS) transistor comprising a third source/drain diffusion region, a fourth source/drain diffusion region, a second gate layer formed between the third source/drain diffusion region and the fourth source/drain diffusion region, and an extended gate layer formed from the second gate layer to the second block layer. The second gate layer is electrically connected to a second word line for inducing a channel between the third source/drain diffusion region and the fourth source drain diffusion region. A third contact is electrically connected to the third source/drain diffusion region for receiving a third select signal, and a fourth contact is electrically connected to the fourth source/drain diffusion region for receiving a fourth select signal.

According to a third embodiment of the present invention, a mask-defined read-only memory array is formed on a substrate. The mask-defined read-only memory array comprises a first ROM bit and a second ROM bit of opposite polarities. The first ROM bit comprises a first floating layer, a first metal-oxide-silicon (MOS) transistor, a first contact, and a second contact. The first MOS transistor comprises a first source/drain diffusion region, a second source/drain diffusion region, a first inter-polysilicon dielectric layer formed on the first floating layer, and a first gate layer formed on the first inter-polysilicon dielectric layer. The first gate layer is electrically connected to a first word line. The first contact is electrically connected to the first source/drain diffusion region for receiving a first select signal. The second contact is electrically connected to the second source/drain diffusion region for receiving a second select signal. The second ROM bit comprises a second floating layer, a second MOS transistor, a third contact, and a fourth contact. The second MOS transistor comprises a third source/drain diffusion region, a fourth source/drain diffusion region, and a second gate layer formed on the second floating layer. The second gate layer is electrically connected to a second word line for inducing a channel between the third source/drain diffusion region and the fourth source drain diffusion region. The third contact is electrically connected to the third source/drain diffusion region for receiving a third select signal. The fourth contact is electrically connected to the fourth source/drain diffusion region for receiving a fourth select signal.

According to an embodiment of the present invention, a method of transforming a one-time programming (OTP) memory into coded non-volatile memory on a substrate comprises forming a first polysilicon gate over a first region of the substrate and forming a second polysilicon gate over a second region of the substrate different from the first region. A block layer is formed parallel to the first polysilicon gate over the first region of the substrate. The block layer and the first polysilicon gate are not electrically connected. Diffusion regions are formed on a first side of the first polysilicon gate, between the first polysilicon gate and the block layer, on a side of the block layer opposite the second diffusion region, on a first side of the second polysilicon gate, and on a side of the second polysilicon gate opposite the fourth diffusion region. Contacts are formed on the first diffusion region, the third diffusion region, the fourth diffusion region, and the fifth diffusion region.

According to an embodiment of the present invention, a method of transforming a one-time programming (OTP) memory into coded non-volatile memory on a substrate comprises forming a first polysilicon gate over a first region of the substrate, and forming a second polysilicon gate over a second region of the substrate different from the first region. A floating polysilicon layer is formed parallel to the first polysilicon gate over the first region of the substrate. The floating polysilicon layer and the first polysilicon gate are not electrically connected. An extended polysilicon gate layer is formed adjacent to the second polysilicon gate. The extended polysilicon gate layer and the second polysilicon gate are electrically connected. Diffusion regions are formed on a first side of the first polysilicon gate, between the first polysilicon gate and the floating polysilicon layer, on a side of the floating polysilicon layer opposite the second diffusion region, on a first side of the second polysilicon gate, and on a side of the extended polysilicon gate layer opposite the fourth diffusion region. Contacts are formed on the first diffusion region, on the third diffusion region, on the fourth diffusion region, and on the fifth diffusion region.

According to an embodiment of the present invention, a method of transforming a one-time programming (OTP) memory into coded non-volatile memory on a substrate comprises forming a first floating polysilicon layer over a first region of the substrate and a second floating polysilicon layer over a second region of the substrate different from the first region in one process. An inter-polysilicon dielectric layer is formed on the first floating polysilicon layer. A first gate layer is formed on the inter-polysilicon dielectric layer, and a second gate layer is formed on the second floating polysilicon layer in one process. Diffusion regions are formed on a first side of the first gate layer, on a side of the first gate layer opposite the first diffusion region, on a first side of the second gate layer, and on a side of the second gate layer opposite the third diffusion region. Contacts are formed on the first diffusion region, the second diffusion region, the third diffusion region, and the fourth diffusion region.

These and other objectives of the present invention will no doubt become obvious to those of ordinary skill in the art after reading the following detailed description of the preferred embodiment that is illustrated in the various figures and drawings.

DETAILED DESCRIPTION

In the following, ROM bits maybe shown formed on a single bit line, different bit lines, a single word line, or different word lines. However, none of the above combinations is intended to be a limitation of the invention. Arrangement of the ROM bits in the figures is as shown simply for efficiency of description.

Figure 7A:
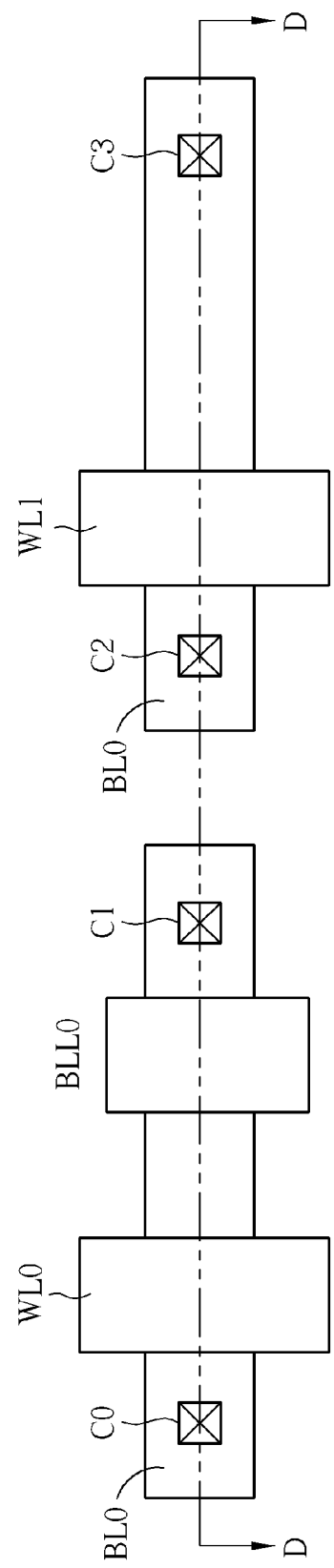
FIG. 7A and FIG. 7B are diagrams of mask-defined ROM bits according to an embodiment of the present invention.
Figure 7B:
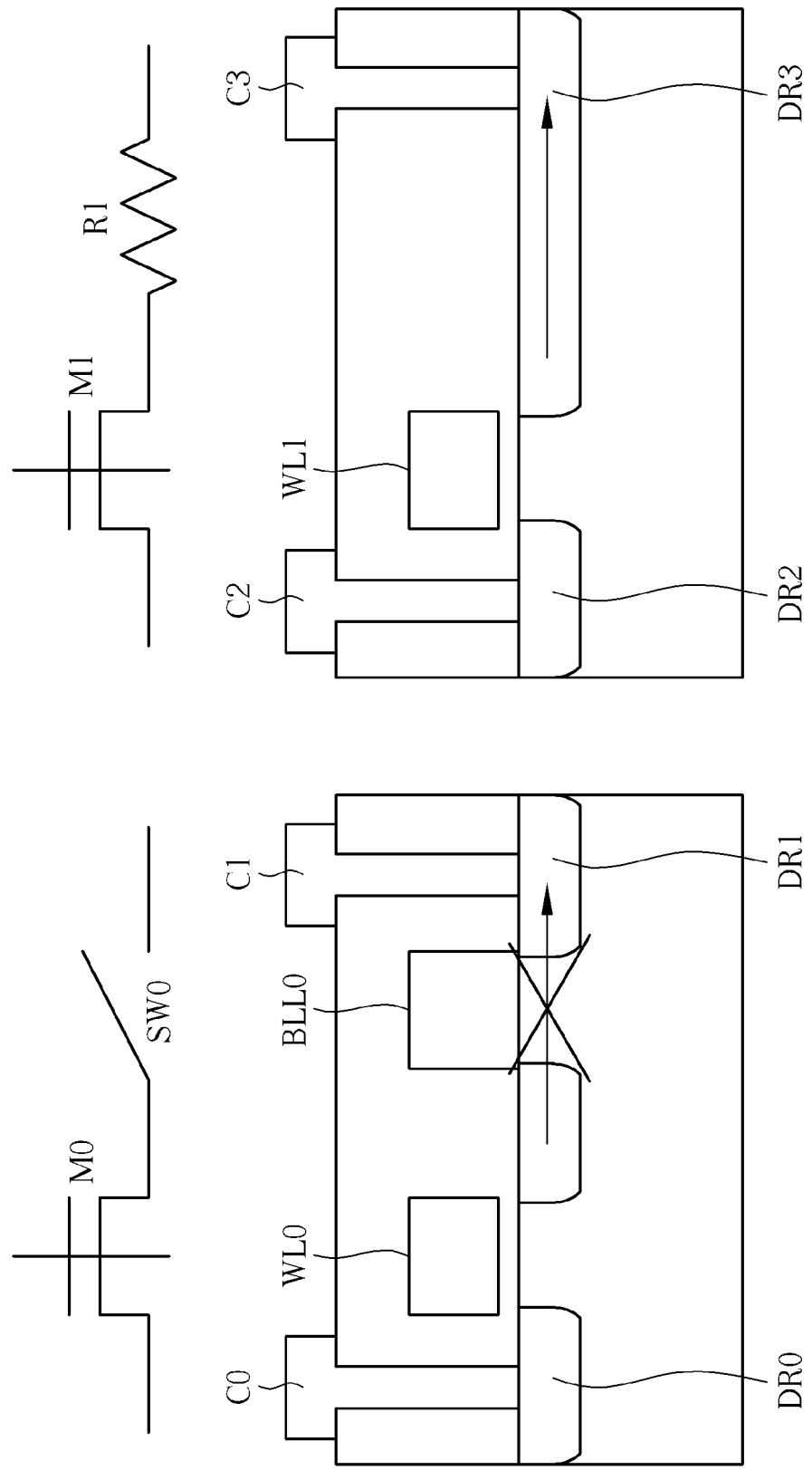

Please refer to FIG. 7A and FIG. 7B, which are diagrams of mask-defined ROM bits according to an embodiment of the present invention. FIG. 7A shows a top view of layout of the ROM bits; FIG. 7B shows a cutaway view of the ROM bits along line D-D of FIG. 7A. As shown in FIG. 7A, a first ROM bit with bit polarity of "0" may be formed at an intersection of a bit line BL0 and a first word line WL0; a second ROM bit with bit polarity of "1" may be formed at an intersection of the bit line BL0 and a second word line WL1. The first ROM bit may include a first contact C0 and a second contact C1 for electrically connecting to a first diffusion region DR0 and a second diffusion region DR1, respectively. Likewise, the second ROM bit may include a third contact C2 and a fourth contact C3 for electrically connecting to a third diffusion region DR2 and a fourth diffusion region DR3, respectively. During fabrication, a block layer BLL0 may be formed between the word line WL0 and the second contact C1 prior to formation of the second diffusion region DR1, as shown in FIG. 7A and FIG. 7B. Thus, when the diffusion regions DR0-DR3 are formed, the second diffusion region DR1 will be discontinuous, e.g. separated into two disconnected regions, whereas the fourth diffusion region DR3 will be continuous. The first ROM bit may be seen as a first transistor M0 in series with an open circuit SW0. The second ROM bit may be seen as a second transistor M1 in series with a resistor R0 (the fourth diffusion region DR3 acts as a diffusion resistor), or short circuit. Thus, bit polarity of the first ROM bit and the second ROM bit may be distinguished through the open circuit and short circuit formed by blocking or allowing continuous formation of the second diffusion region DR1 or the fourth diffusion region DR3.

Figure 8A:
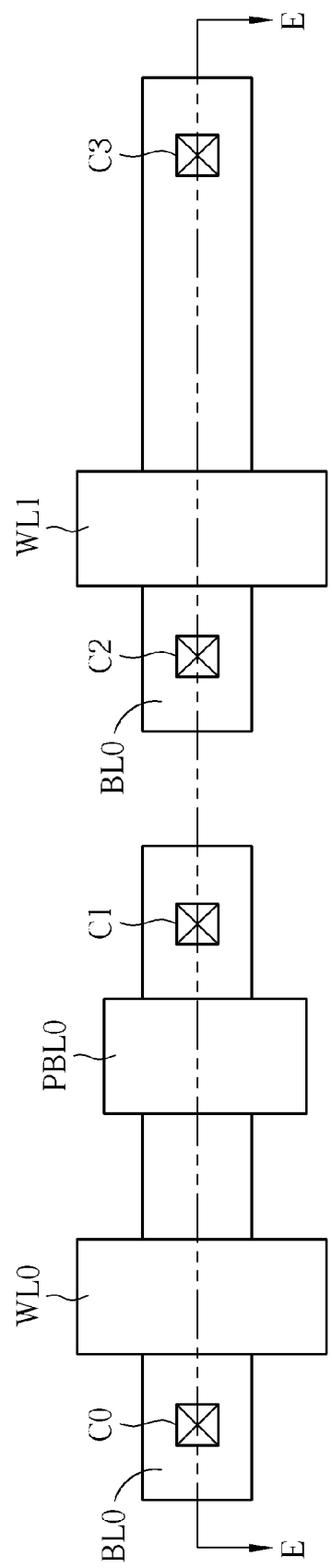
FIG. 8A and FIG. 8B are diagrams of mask-defined ROM bits according to a first embodiment of the present invention.
Figure 8B:
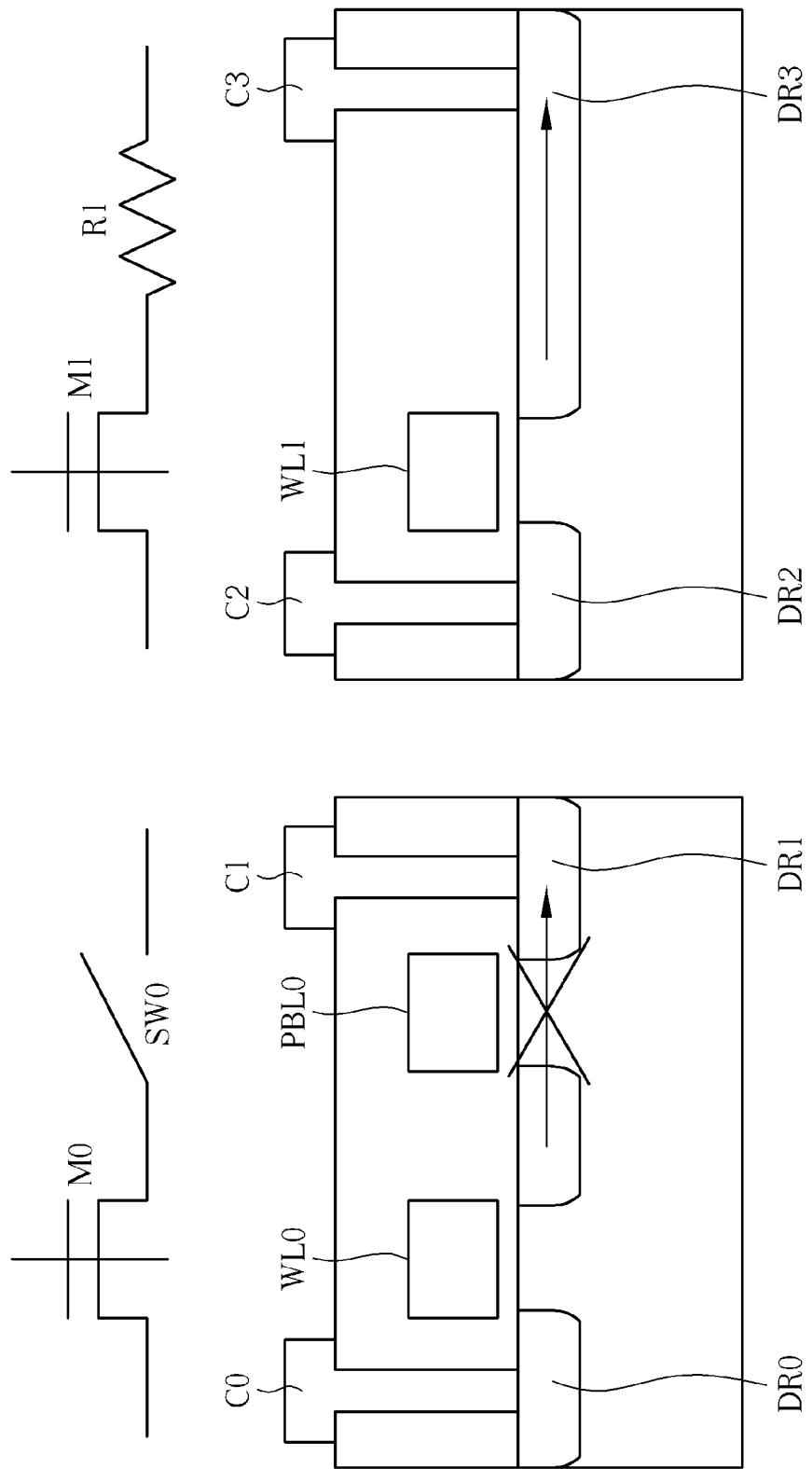

Please refer to FIG. 8A and FIG. 8B, which are diagrams of mask-defined ROM bits according to a first embodiment of the present invention. FIG. 8A shows a top view of layout of the ROM bits; FIG. 8B shows a cutaway view of the ROM bits along line E-E of FIG. 8A. As shown in FIG. 8A, a first ROM bit with bit polarity of "0" may be formed at an intersection of a bit line BL0 and a first word line WL0; a second ROM bit with bit polarity of "1" may be formed at an intersection of the bit line BL0 and a second word line WL1. The first ROM bit may include a first contact C0 and a second contact C1 for electrically connecting to a first diffusion region DR0 and a second diffusion region DR1, respectively. Likewise, the second ROM bit may include a third contact C2 and a fourth contact C3 for electrically connecting to a third diffusion region DR2 and a fourth diffusion region DR3, respectively. In the first embodiment shown in FIG. 8A and FIG. 8B, during fabrication, a polysilicon block layer PBL0 may be formed between the word line WL0 and the second contact C1 prior to formation of the second diffusion region DR1, as shown in FIG. 8A and FIG. 8B. Thus, when the diffusion regions DR0-DR3 are formed, the second diffusion region DR1 will be discontinuous, e.g. separated into two disconnected regions, whereas the fourth diffusion region DR3 will be continuous. The first ROM bit may be seen as a first transistor M0 in series with an open circuit SW0. The second ROM bit may be seen as a second transistor M1 in series with a resistor R1 (the fourth diffusion region DR3 acts as a diffusion resistor), or short circuit. Thus, bit polarity of the first ROM bit and the second ROM bit may be distinguished through the open circuit and short circuit formed by blocking or allowing continuous formation of the second diffusion region DR1 or the fourth diffusion region DR3.

Figure 9A:
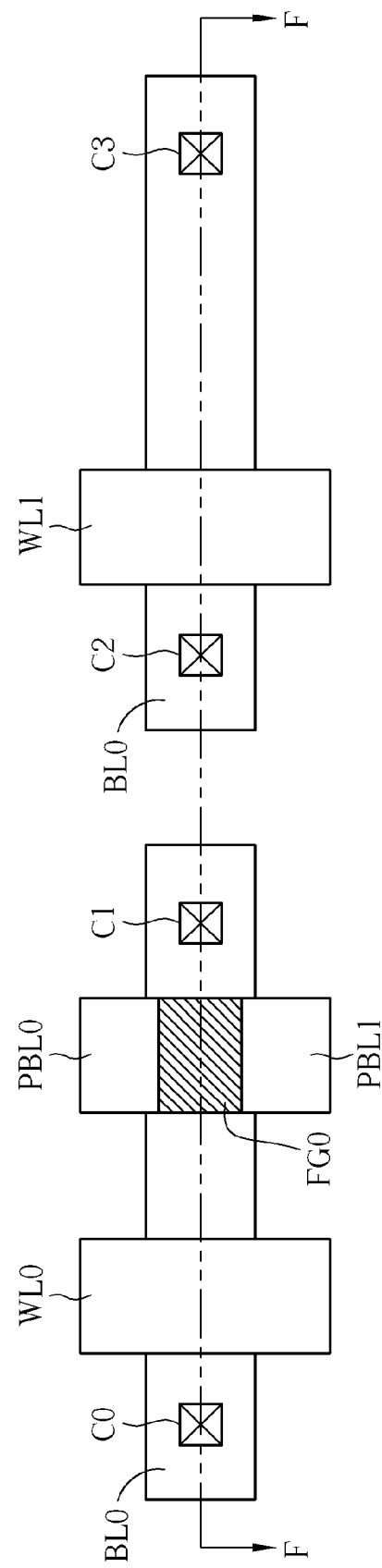
FIG. 9A and FIG. 9B are diagrams of mask-defined ROM bits according to a second embodiment of the present invention.
Figure 9B:
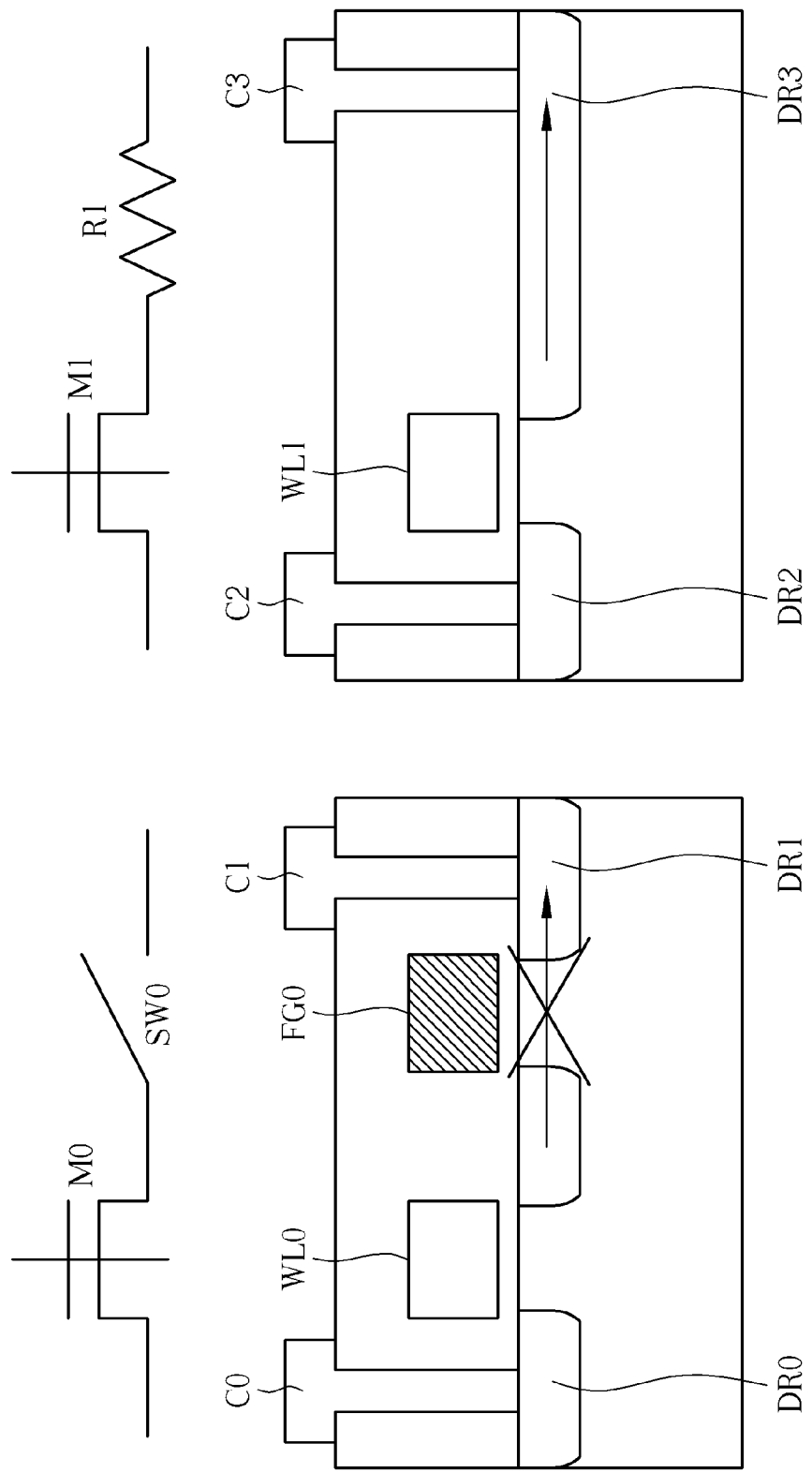

Please refer to FIG. 9A and FIG. 9B, which are diagrams of mask-defined ROM bits according to a second embodiment of the present invention. FIG. 9A shows a top view of layout of the ROM bits; FIG. 9B shows a cutaway view of the ROM bits along line F-F of FIG. 9A. As shown in FIG. 9A, a first ROM bit with bit polarity of "0" may be formed at an intersection of a bit line BL0 and a first word line WL0; a second ROM bit with bit polarity of "1" may be formed at an intersection of the bit line BL0 and a second word line WL1. The first ROM bit may include a first contact C0 and a second contact C1 for electrically connecting to a first diffusion region DR0 and a second diffusion region DR1, respectively. Likewise, the second ROM bit may include a third contact C2 and a fourth contact C3 for electrically connecting to a third diffusion region DR2 and a fourth diffusion region DR3, respectively. In the first embodiment shown in FIG. 9A and FIG. 9B, during fabrication, a first polysilicon block layer PBL0 and a second polysilicon block layer PBL1 may be formed between the word line WL0 and the second contact C1 prior to formation of the second diffusion region DR1, as shown in FIG. 9A and FIG. 9B. Then, a gap between the first polysilicon layer PBL0 and the second polysilicon layer PBL1 may be filled in to form a fill-in block layer FG0. Thus, when the diffusion regions DR0-DR3 are formed, the second diffusion region DR1 will be discontinuous, e.g. separated into two disconnected regions, whereas the fourth diffusion region DR3 will be continuous. The first ROM bit may be seen as a first transistor M0 in series with an open circuit SW0. The second ROM bit may be seen as a second transistor M1 in series with a resistor R1 (the fourth diffusion region DR3 acts as a diffusion resistor), or short circuit. Thus, bit polarity of the first ROM bit and the second ROM bit may be distinguished through the open circuit and short circuit formed by blocking or allowing continuous formation of the second diffusion region DR1 or the fourth diffusion region DR3.

Figure 10A:
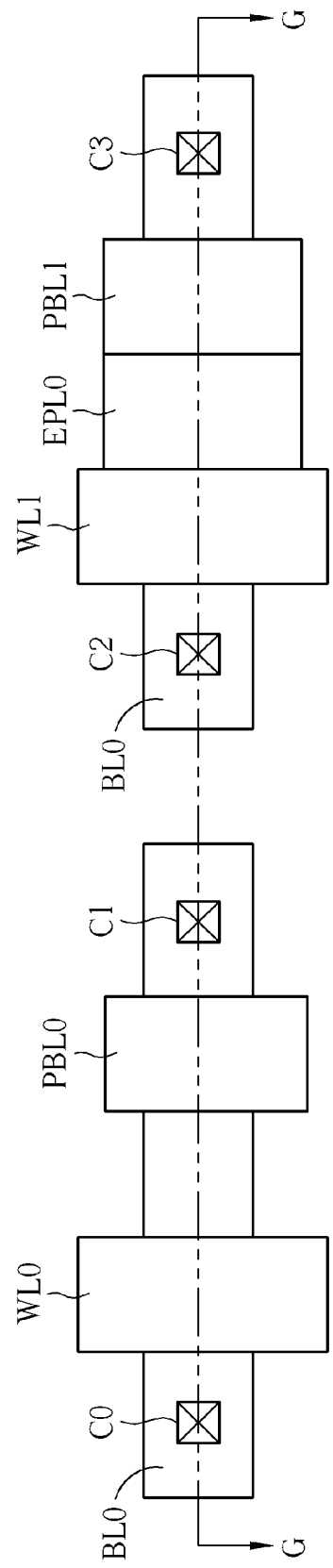
FIG. 10A and FIG. 10B are diagrams of mask-defined ROM bits according to a third embodiment of the present invention.
Figure 10B:
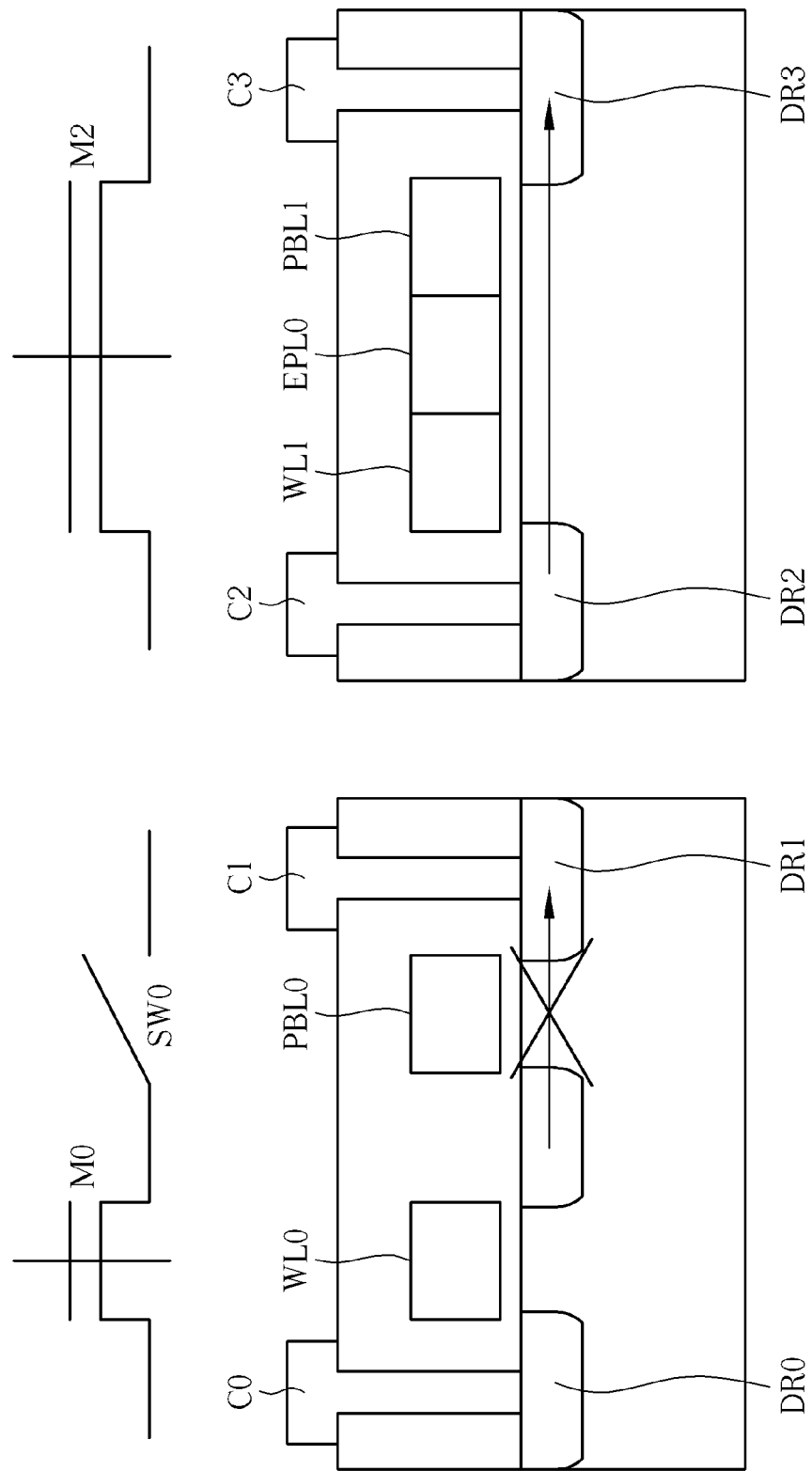

Please refer to FIG. 10A and FIG. 10B, which are diagrams of mask-defined ROM bits according to a third embodiment of the present invention. FIG. 10A shows a top view of layout of the ROM bits; FIG. 10B shows a cutaway view of the ROM bits along line G-G of FIG. 10A. As shown in FIG. 10A, a first ROM bit with bit polarity of "0" may be formed at an intersection of a bit line BL0 and a first word line WL0; a second ROM bit with bit polarity of "1" may be formed at an intersection of the bit line BL0 and a second word line WL1. The first ROM bit may include a first contact C0 and a second contact C1 for electrically connecting to a first diffusion region DR0 and a second diffusion region DR1, respectively. Likewise, the second ROM bit may include a third contact C2 and a fourth contact C3 for electrically connecting to a third diffusion region DR2 and a fourth diffusion region DR3, respectively. In the first embodiment shown in FIG. 10A and FIG. 10B, during fabrication, a first polysilicon block layer PBL0 may be formed between the word line WL0 and the second contact C1 prior to formation of the second diffusion region DR1, as shown in FIG. 10A and FIG. 10B. Thus, when the diffusion regions DR0-DR3 are formed, the second diffusion region DR1 will be discontinuous, e.g. separated into two disconnected regions. Likewise, a second polysilicon block layer PBL1 may be formed between the word line WL1 and the fourth contact C3. To distinguish between the first ROM bit and the second ROM bit, an extended polysilicon layer EPL0 may be formed between the word line WL1 and the second polysilicon block layer PBL1 for establishing a continuous extended polysilicon gate comprising the word line WL1, the extended polysilicon layer EPL0, and the second polysilicon block layer PBL1. In this way, a second transistor M2 may be formed having a gate terminal realized through the extended polysilicon gate, and drain/source terminals realized through the third diffusion region DR2 and the fourth diffusion region DR3. Channel length of the second transistor M2 may be longer than channel length of a first transistor M0 formed by the first diffusion region DR1, the word line WL0, and the disconnected region of the second diffusion region DR2 nearest the word line WL1. The first ROM bit may be seen as the first transistor M0 in series with an open circuit SW0. The second ROM bit may be seen as the second transistor M2. Thus, bit polarity of the first ROM bit and the second ROM bit may be distinguished through the open circuit SW0 and second transistor M2 formed by blocking continuous formation of the second diffusion region DR1 or by extending the polysilicon gate, respectively.

Figure 11A:
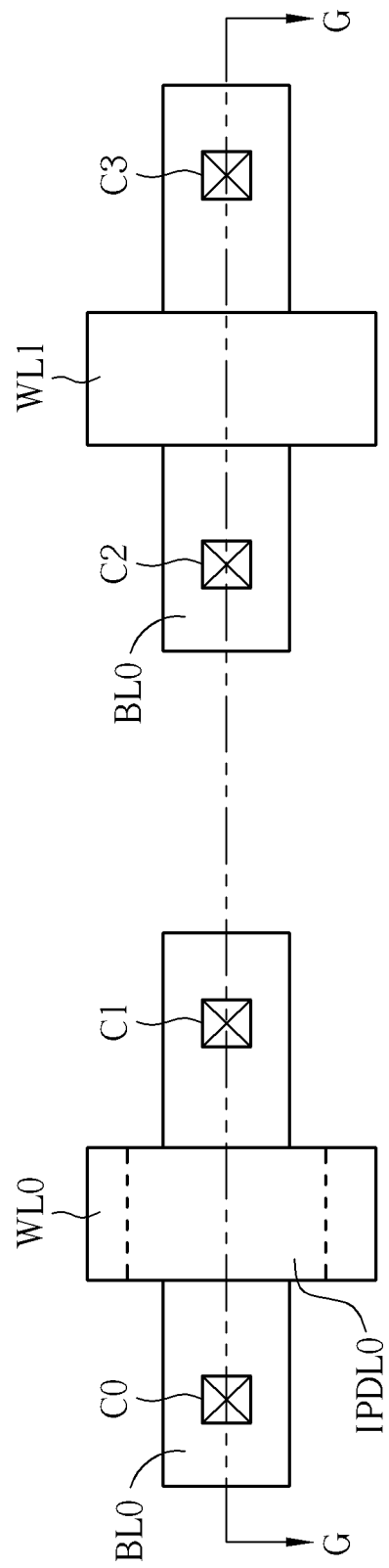
FIG. 11A and FIG. 11B are diagrams of mask-defined ROM bits according to a fourth embodiment of the present invention.
Figure 11B:
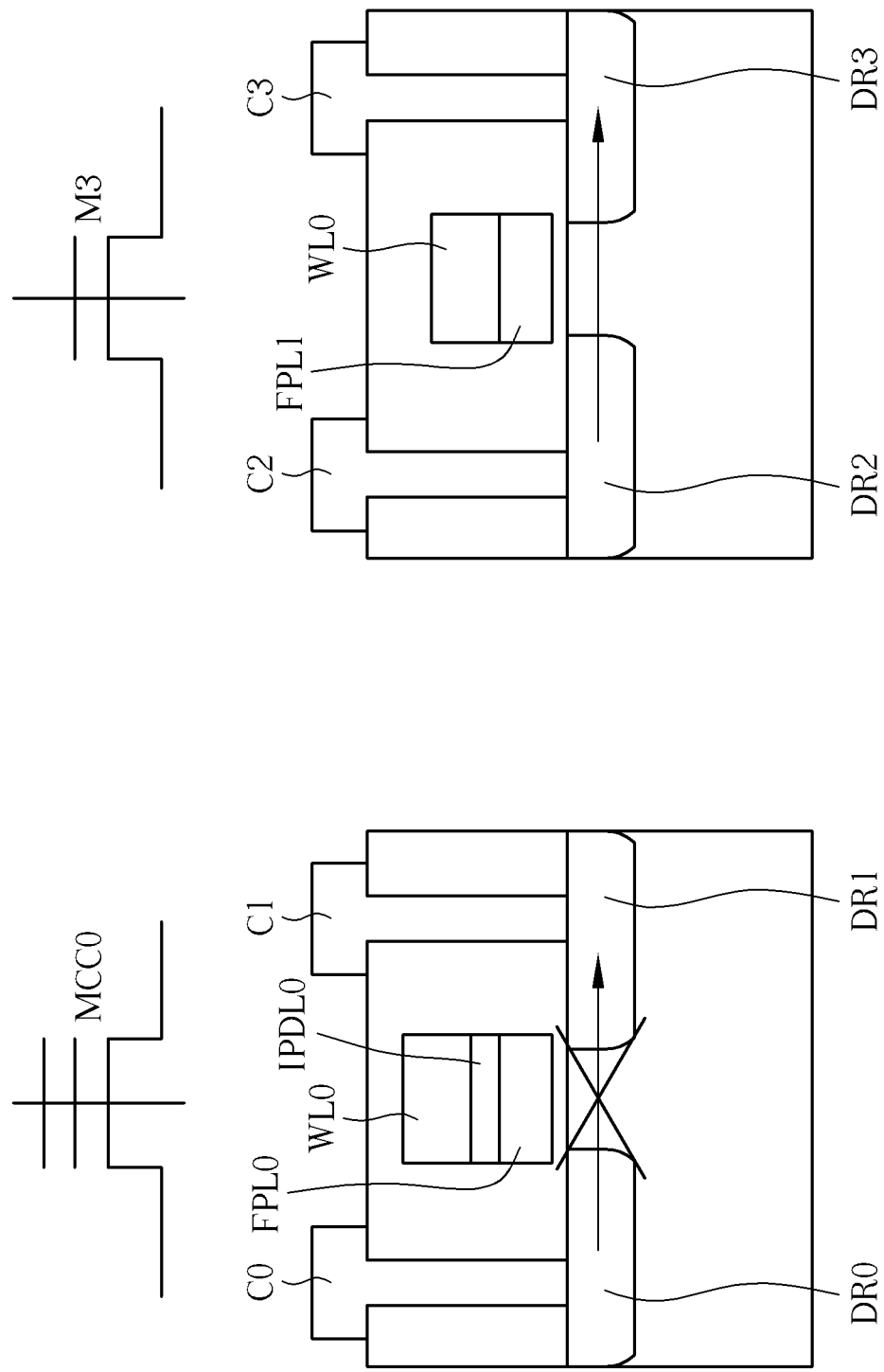

Please refer to FIG. 11A and FIG. 11B, which are diagrams of mask-defined ROM bits according to a fourth embodiment of the present invention. FIG. 11A shows a top view of layout of the ROM bits; FIG. 11B shows a cutaway view of the ROM bits along line H-H of FIG. 11A. As shown in FIG. 11A, a first ROM bit with bit polarity of "0" may be formed at an intersection of a bit line BL0 and a first word line WL0; a second ROM bit with bit polarity of "1" may be formed at an intersection of the bit line BL0 and a second word line WL1. The first ROM bit may include a first contact C0 and a second contact C1 for electrically connecting to a first diffusion region DR0 and a second diffusion region DR1, respectively. Likewise, the second ROM bit may include a third contact C2 and a fourth contact C3 for electrically connecting to a third diffusion region DR2 and a fourth diffusion region DR3, respectively. The first ROM bit may further comprise a first floating polysilicon layer FPL0 formed between the word line WL0 and the substrate. Likewise, the second ROM bit may further comprise a second floating polysilicon layer FPL1 formed between the word line WL1 and the substrate. To distinguish between bit polarities, the first ROM bit may include an inter-polysilicon dielectric layer IPDL0 formed between the word line WL0 and the first floating polysilicon layer FPL0. The inter-polysilicon dielectric layer IPDL0 may be an ONO layer. In the second ROM bit, the word line WL1 may be formed directly on the second floating polysilicon layer FPL1. The word line WL1 and the second floating polysilicon layer FPL1 are an electrical short circuit. Thus, the first ROM bit may be seen as a capacitively-coupled transistor MCC0. The second ROM bit may be seen as a second transistor M3. The capacitively-coupled transistor MCC0 may low controllability through the word line WL0 due to the first floating polysilicon layer FPL0, whereas the second transistor M3 may have good controllability through the second word line WL1. Thus, bit polarity of the first ROM bit and the second ROM bit may be distinguished through ease/difficulty with which the capacitively-coupled transistor MCC0 and the second transistor M1 are turned on.

Figure 12:
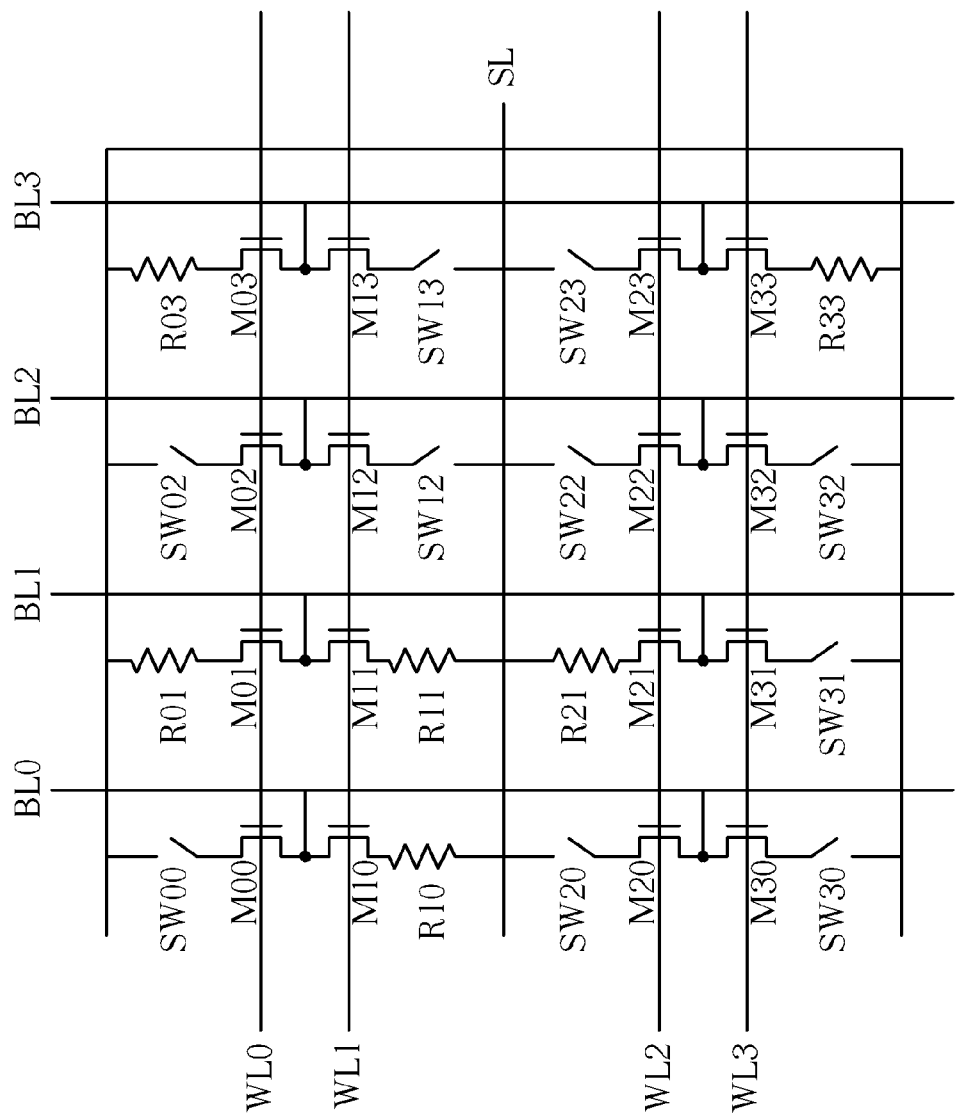
FIG. 12 is a diagram of a first ROM array according to an embodiment of the present invention.

In practical implementation, ROM bits like the first ROM bit and the second ROM bit described above may be incorporated into a ROM array. Please refer to FIG. 12, which is a diagram of a first ROM array according to an embodiment of the present invention. The first ROM array comprises a plurality of transistors M00-M33 electrically connected to a plurality of word lines WL0-WL3, a plurality of bit lines BL0-BL3, and a source line SL. Depending on bit polarity of the ROM bit, each transistor is electrically connected to either an open circuit SWxx or a resistor Rxx. For example, as shown in FIG. 12, a first transistor M00 may be electrically connected to a first open circuit SW00, and a second transistor M01 may be electrically connected to a second resistor R01. The first transistor M00 may have a gate electrode electrically connected to the word line WL0, and the second transistor M01 may have a gate electrode electrically connected to the word line WL0. The first transistor M00 may have a first source/drain electrode electrically connected to the bit line BL0, and the second transistor M01 may have a first source/drain electrode electrically connected to the bit line BL1. The open circuit SW00 may be electrically connected to the source line SL, and the resistor R01 may be electrically connected to the source line SL. Thus, in operation, when the word line WL0 is asserted, gate electrodes of the transistors M00-M03 may be charged, causing channels to be formed in the transistors M00-M03. When the bit line BL0 is also asserted, the first transistor M00 may not conduct due to the open circuit SW00 between the source line and the second source/drain electrode of the first transistor M00. When the bit line BL1 is asserted with the word line WL0, the second transistor M01 may conduct due to the resistor R01 electrically connected between the source line SL and the second drain/source electrode of the second transistor M01. The transistors M00-M03 may be considered symmetric with the transistors M10-M13. Likewise, the transistors M20-M23 may be considered symmetric with the transistors M30-M33. Thus, operation of each of the transistors M02-M33 is similar to operation of the first transistor M00 and the second transistor M01. In summary, each transistor has a gate electrode electrically connected to a word line, a first source/drain terminal electrically connected to a bit line, and a second source/drain terminal either electrically connected to a source line through a diffusion resistor or electrically disconnected from the source line due to an open circuit (the discontinuous diffusion region described above).

Figure 13:
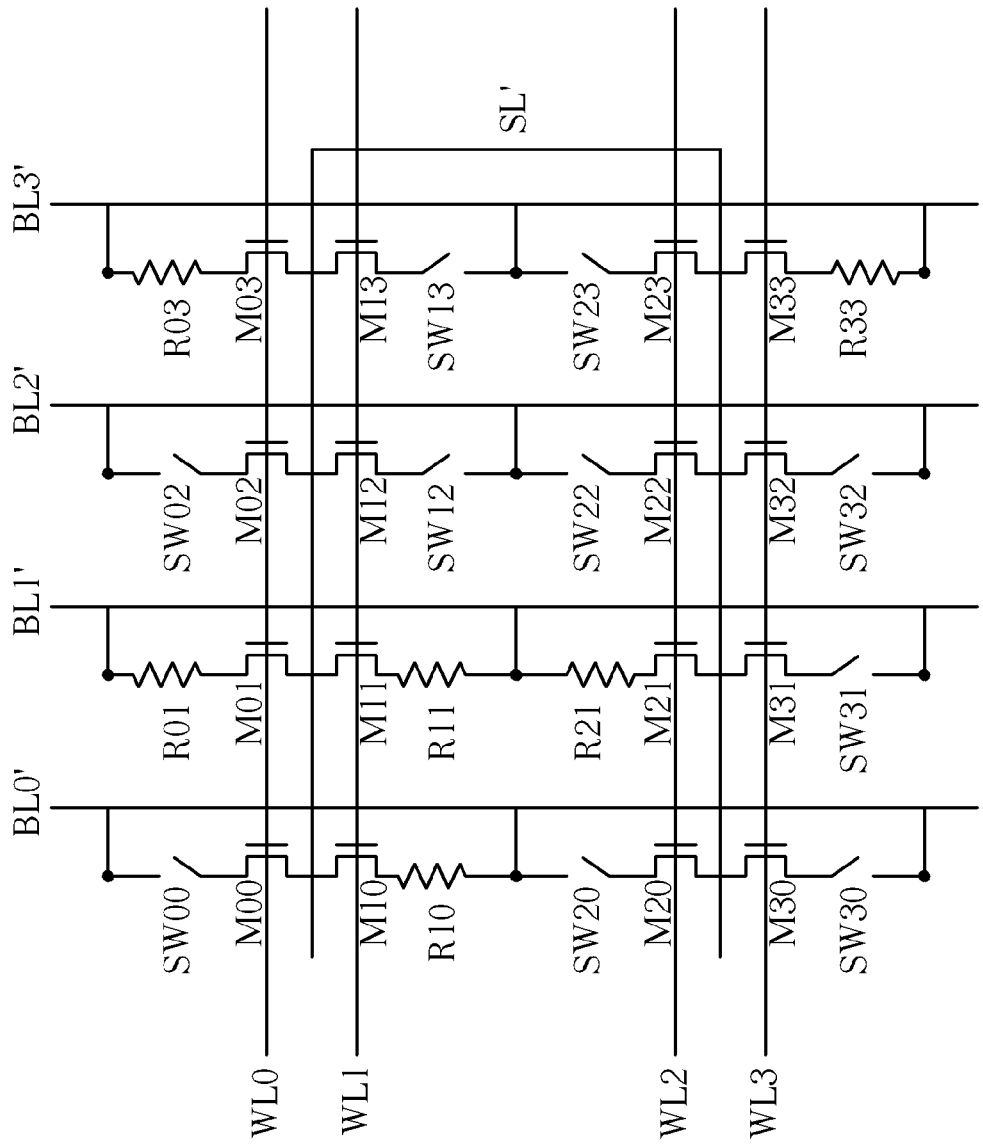
FIG. 13 is a diagram of a second ROM array according to another embodiment of the present invention.

Please refer to FIG. 13, which is a diagram of a second ROM bit array according to another embodiment of the present invention Similar reference numerals indicate similar components to the first ROM bit array. The second ROM bit array utilizes a different connection topology from the first ROM bit array, as can be seen from FIG. 13. While gate electrodes of the transistors M00-M33 remain coupled to the word lines WL0-WL3, in the second ROM bit array, a source line SL' is electrically connected to the first source/drain terminals of the transistors M00-M33. Further, bit lines BL0'-BL3' are either electrically connected to the second source/drain terminals of the transistors M00-M33 through corresponding diffusion resistors or electrically disconnected from the second source/drain terminals due to corresponding open circuits (the discontinuous diffusion regions described above).

Figure 1:
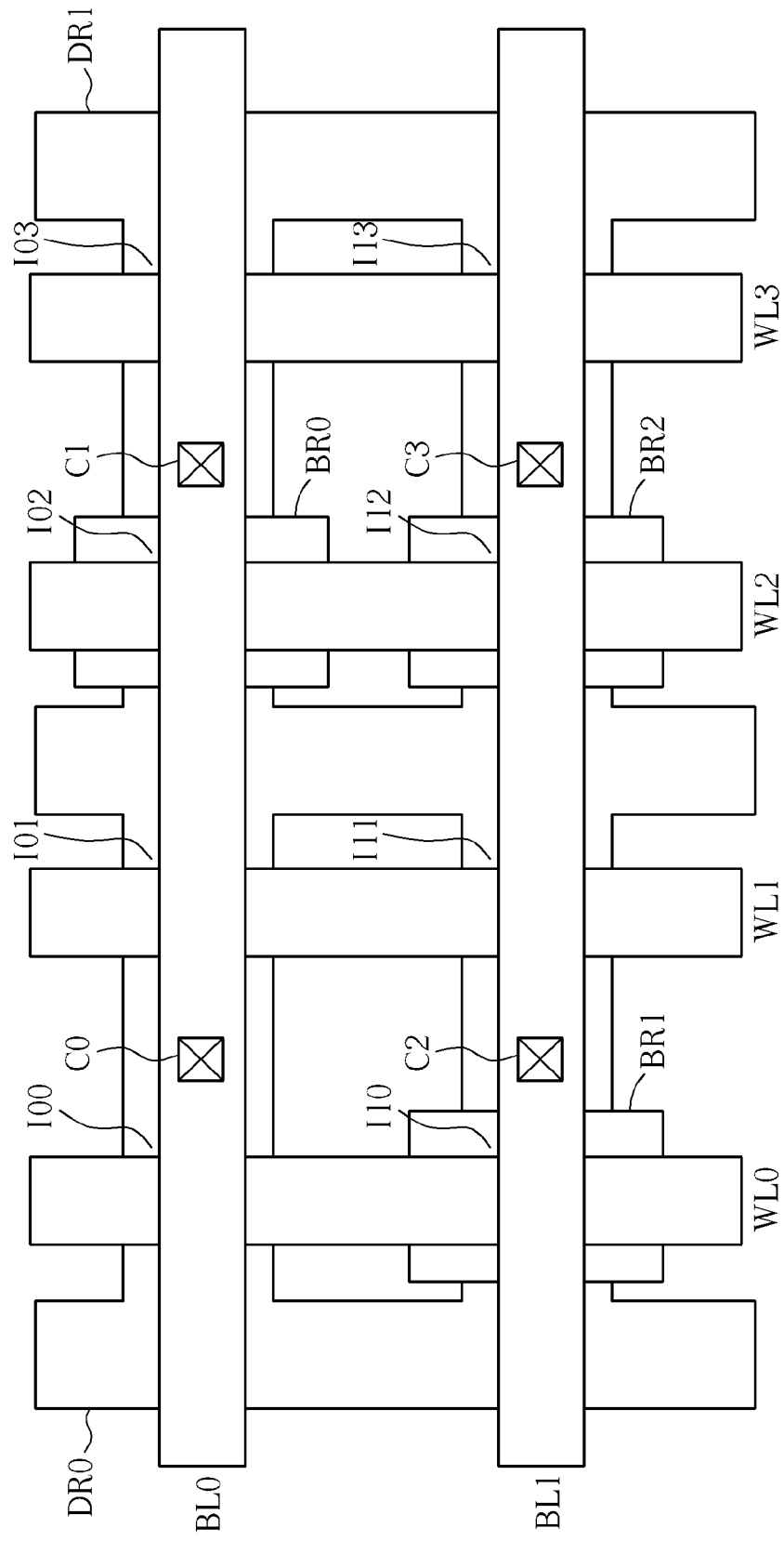
FIG. 1 is a diagram of eight ROM bits defined through active area regions.
Figure 2:
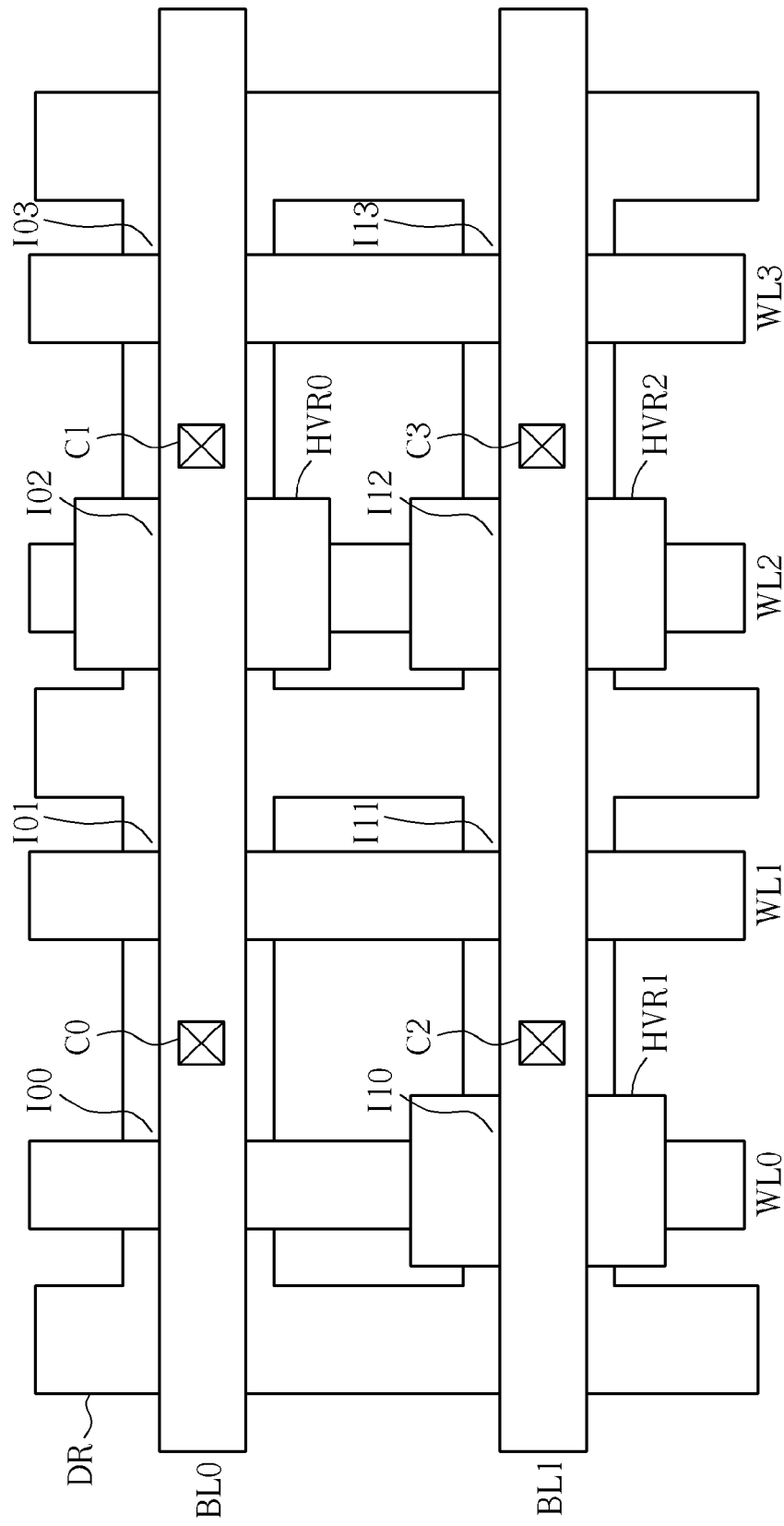
FIG. 2 is a diagram of eight ROM bits defined through high/low $V_{TH}$ transistors.
Figure 3:
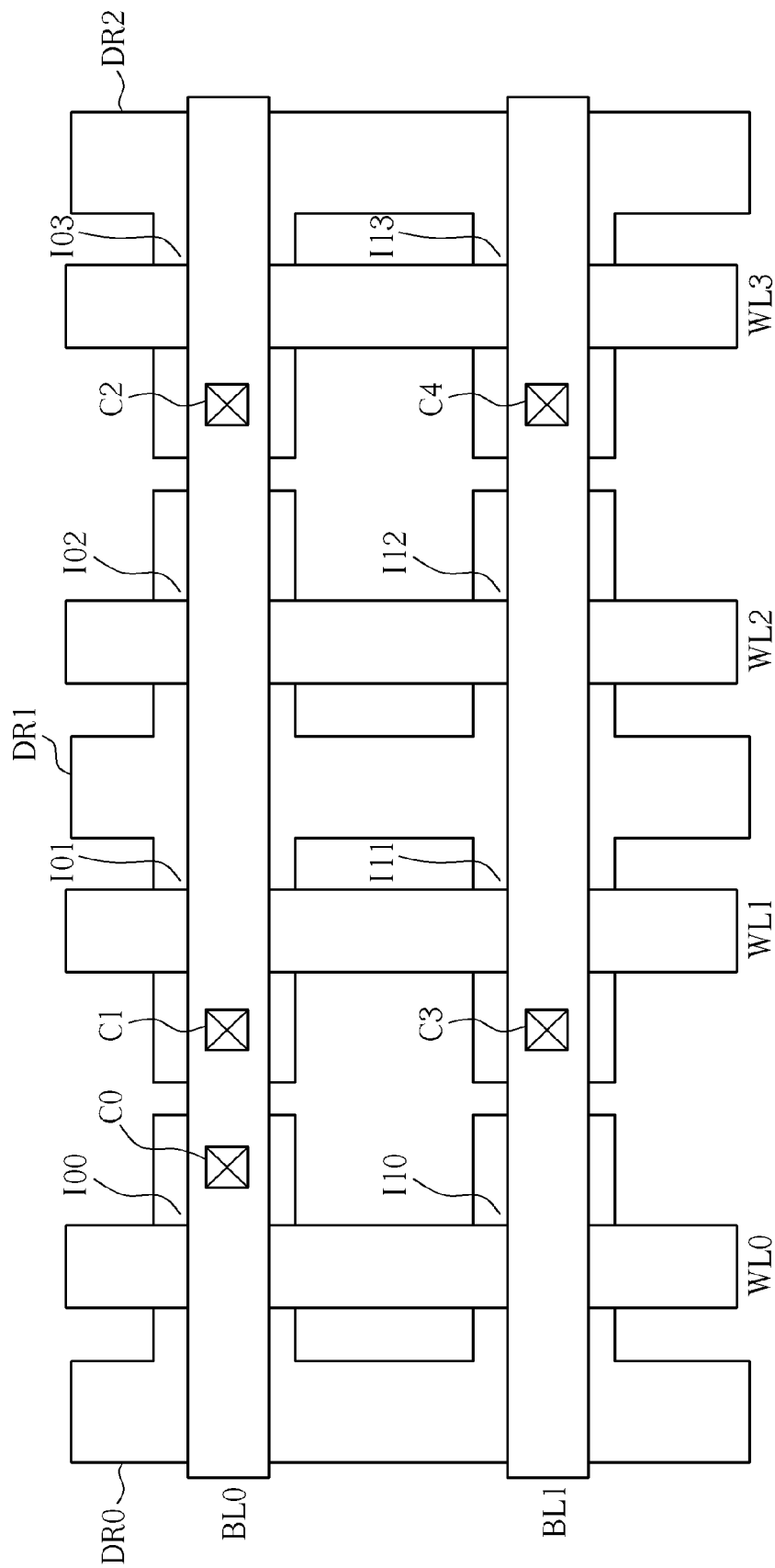
FIG. 3 is a diagram of eight ROM bits defined through use of vias.
Figure 4A:
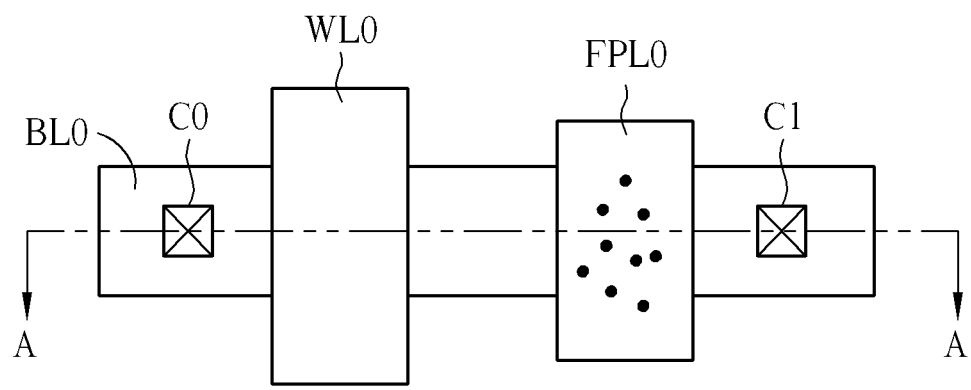
FIG. 4A and FIG. 4B are diagrams of an EPROM bit.
Figure 4B:
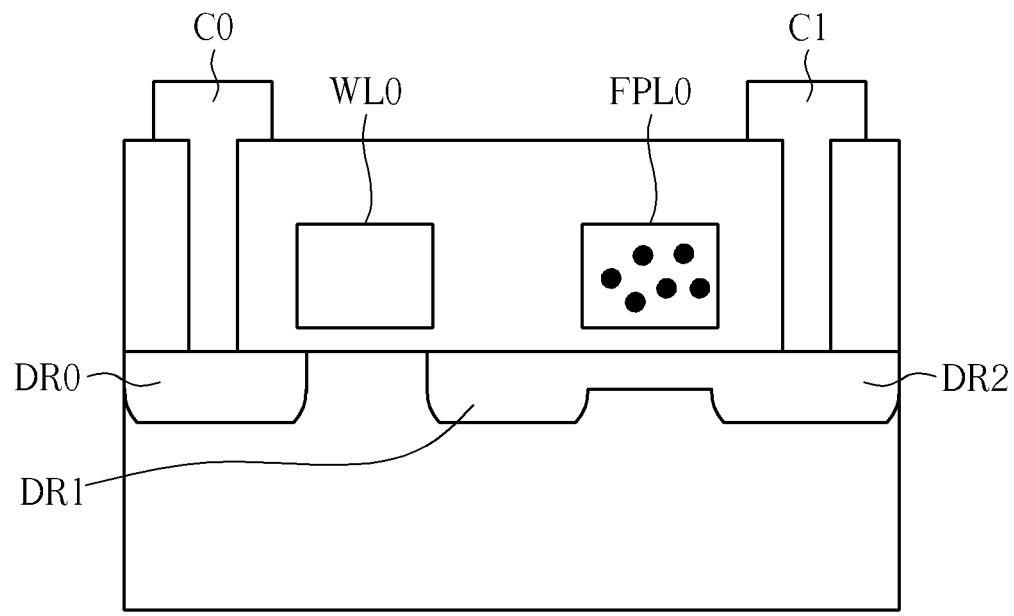
Figure 5A:
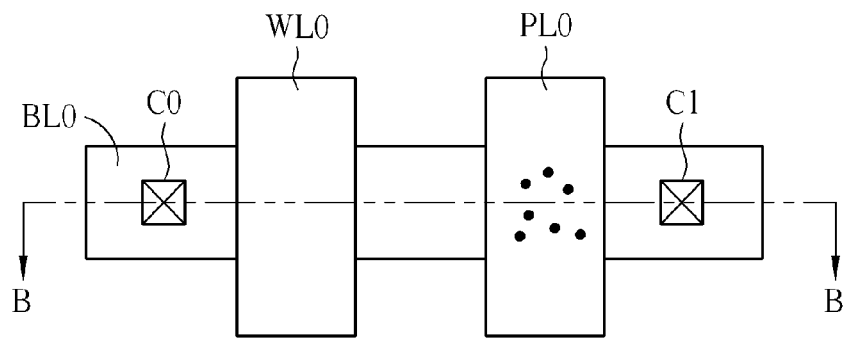
FIG. 5A and FIG. 5B are diagrams of a second type of EPROM bit.
Figure 5B:
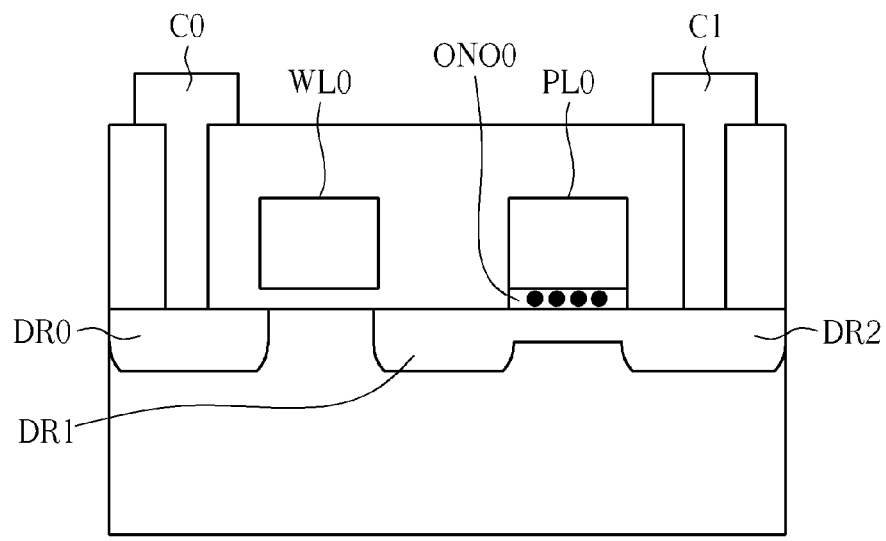
Figure 6A:
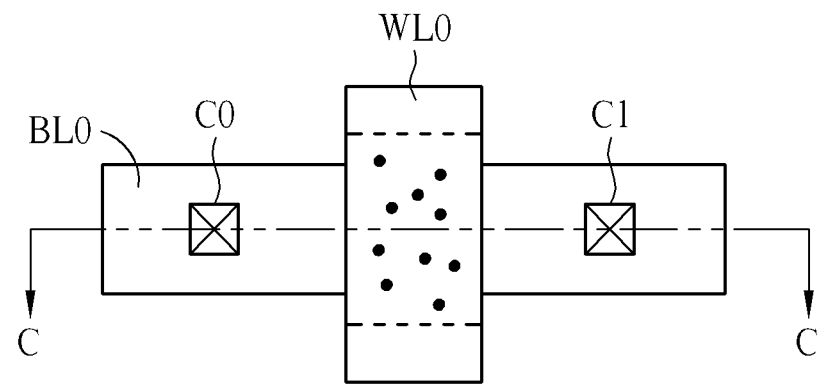
FIG. 6A and FIG. 6B are diagrams of a third type of EPROM bit.
Figure 6B:
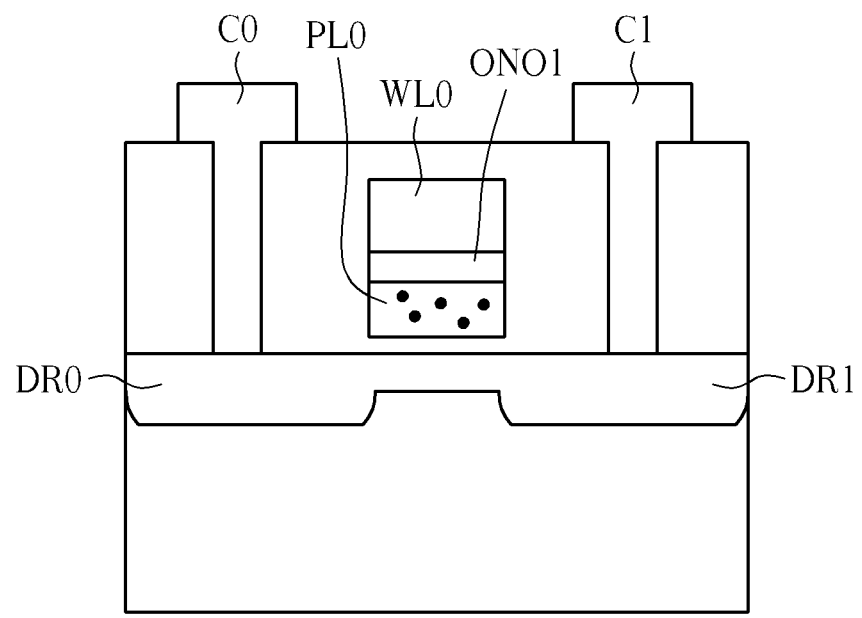

During fabrication, it may be advantageous to integrate the ROM bits described above into existing processes. Thus, methods for directly transforming CMOS-compatible single-poly one-time programming (OTP) memory into coded non-volatile memory without the need for redesigning the peripheral circuitry are described herein. For example, the ROM bit of FIG. 4A and FIG. 4B may be transformed into the second ROM bit of FIG. 8A and FIG. 8B by not forming the floating polysilicon layer FPL0. Thus, an EPROM bit as shown in FIG. 4A and FIG. 4B is distinguished by channel formation induced by electrons in the floating polysilicon layer FPL0. However, using the same EPROM fabrication process, by not forming the floating polysilicon layer FPL0, a mask-defined ROM bit may be formed that is distinguished by conductivity due to the continuous diffusion region described above. The EPROM bit shown in FIG. 5A and FIG. 5B may be transformed to the ROM bits of FIG. 8A and 8B by the same steps. In another embodiment, instead of not forming the floating polysilicon layer FPL0, the extended polysilicon layer EPL0 shown in FIG. 10A and FIG. 10B may be formed between the word line and the floating polysilicon layer FPL0. Thus, ROM bits having only the word line and the floating polysilicon layer may be non-conductive, and ROM bits having the extended polysilicon layer may be conductive. In this way, the EPROM fabrication process may also be utilized to form mask-defined ROM bits according to the architecture shown in FIG. 10A and FIG. 10B. Finally, the EPROM bit shown in FIG. 6A and FIG. 6B may also be transformed to the mask-defined ROM bits shown in FIG. 11A and FIG. 11B. Namely, without introducing charges into the inter-polysilicon dielectric layer ONO1, the EPROM bit of FIG. 6A and FIG. 6B may be transformed by not forming the inter-polysilicon dielectric layer ONO1, i.e. by forming the word line directly on the floating polysilicon layer. Thus, using the same EPROM fabrication process, a ROM bit of a first polarity may be formed by forming the inter-polysilicon dielectric layer ONO1 between the word line and the floating polysilicon layer, and a ROM bit of a second polarity opposite the first polarity may be formed by forming the word line directly on the floating polysilicon layer with no inter-polysilicon dielectric layer formed in between.

From the above it can be seen that a new mask-defined ROM is presented that utilizes a block layer for stopping formation of a diffusion resistor. Additionally, the method of transforming a CMOS-compatible programmable read-only memory (PROM) into coded non-volatile memory provides advantages of not needing to redesign peripheral circuitry, reduced product development time and cost, improved yield, and reduced test time.

Those skilled in the art will readily observe that numerous modifications and alterations of the device and method may be made while retaining the teachings of the invention.

What is claimed is:

1. A mask-defined read-only memory array formed on a substrate, the mask-defined read-only memory array comprising:
    a first ROM bit of a first polarity, the first ROM bit comprising:
        a first block layer formed over a first region of the substrate;
        a first metal-oxide-silicon (MOS) transistor comprising:
            a first source/drain diffusion region formed outside the first region of the substrate on a first side of the first block layer;
            a second source/drain diffusion region formed in the first region of the substrate; and
            a first gate layer electrically connected to a first word line for inducing a channel between the first source/drain diffusion region and the second source drain diffusion region;
        a first contact electrically connected to the first source/drain diffusion region for receiving a first select signal;

a first diffusion region formed in the first region of the substrate on a second side of the first block layer different from the first side of the first block layer; and
a second contact electrically connected to the first diffusion region for receiving a second select signal; and
a second ROM bit of a second polarity opposite the first polarity, the second ROM bit comprising:
a second metal-oxide-silicon (MOS) transistor comprising:
a third source/drain diffusion region;
a fourth source/drain diffusion region; and
a second gate layer formed between the third source/drain diffusion region and the fourth source/drain diffusion region, the second gate layer electrically connected to a second word line for inducing a channel between the third source/drain diffusion region and the fourth source drain diffusion region;
a third contact electrically connected to the third source/drain diffusion region for receiving a third select signal; and
a fourth contact electrically connected to the fourth source/drain diffusion region for receiving a fourth select signal.

2. The mask-defined read-only memory array of claim 1, wherein the first select signal and the third select signal are the same.

3. The mask-defined read-only memory array of claim 1, wherein the second select signal and the fourth select signal are the same.

4. The mask-defined read-only memory array of claim 1, wherein the first word line and the second word line are the same.

5. The mask-defined read-only memory array of claim 1, wherein the first block layer is a polysilicon layer formed in a same process as the first gate layer and the second gate layer.

6. The mask-defined read-only memory array of claim 1, wherein the first block layer comprises:
a first polysilicon block layer;
a fill-in block layer formed adjacent to the first polysilicon block layer; and
a second polysilicon block layer formed adjacent to the fill-in block layer and opposite the fill-in block layer from the first polysilicon block layer.

7. A mask-defined read-only memory array formed on a substrate, the mask-defined read-only memory array comprising:
a first ROM bit of a first polarity, the first ROM bit comprising:
a first block layer formed over a first region of the substrate;
a first metal-oxide-silicon (MOS) transistor comprising:
a first source/drain diffusion region formed outside the first region of the substrate on a first side of the first block layer;
a second source/drain diffusion region formed in the first region of the substrate; and
a first gate layer electrically connected to a first word line for inducing a channel between the first source/drain diffusion region and the second source drain diffusion region;
a first contact electrically connected to the first source/drain diffusion region for receiving a first select signal;
a first diffusion region formed in the first region of the substrate on a second side of the first block layer different from the first side of the first block layer; and
a second contact electrically connected to the first diffusion region for receiving a second select signal; and
a second ROM bit of a second polarity opposite the first polarity, the second ROM bit comprising:
a second block layer formed over a second region of the substrate different from the first region;
a second metal-oxide-silicon (MOS) transistor comprising:
a third source/drain diffusion region;
a fourth source/drain diffusion region formed in the second region;
a second gate layer formed between the third source/drain diffusion region and the fourth source/drain diffusion region, the second gate layer electrically connected to a second word line for inducing a channel between the third source/drain diffusion region and the fourth source drain diffusion region; and
an extended gate layer formed from the second gate layer to the second block layer;
a third contact electrically connected to the third source/drain diffusion region for receiving a third select signal; and
a fourth contact electrically connected to the fourth source/drain diffusion region for receiving a fourth select signal.

8. The mask-defined read-only memory array of claim 7, wherein the first select signal and the third select signal are the same.

9. The mask-defined read-only memory array of claim 7, wherein the second select signal and the fourth select signal are the same.

10. The mask-defined read-only memory array of claim 7, wherein the first word line and the second word line are the same.

11. The mask-defined read-only memory array of claim 7, wherein the first block layer is a polysilicon layer formed in a same process as the first gate layer and the second gate layer.

12. The mask-defined read-only memory array of claim 7, wherein the first block layer comprises:
a first polysilicon block layer;
a fill-in block layer formed adjacent to the first polysilicon block layer; and
a second polysilicon block layer formed adjacent to the fill-in block layer and opposite the fill-in block layer from the first polysilicon block layer.

13. The mask-defined read-only memory array of claim 7, wherein the second block layer is a polysilicon layer formed in a same process as the first gate layer and the second gate layer.

14. A mask-defined read-only memory array formed on a substrate, the mask-defined read-only memory array comprising:
a first ROM bit of a first polarity, the first ROM bit comprising:
a first floating layer;
a first metal-oxide-silicon (MOS) transistor comprising:
a first source/drain diffusion region;
a second source/drain diffusion region;
a first inter-polysilicon dielectric layer formed on the first floating layer; and
a first gate layer formed on the first inter-polysilicon dielectric layer, the first gate layer electrically connected to a first word line;
a first contact electrically connected to the first source/drain diffusion region for receiving a first select signal; and a second contact electrically connected to the second source/drain diffusion region for receiving a second select signal; and a second ROM bit of a second polarity opposite the first polarity, the second ROM bit comprising:
- a second floating layer;
- a second metal-oxide-silicon (MOS) transistor comprising:
  - a third source/drain diffusion region;
  - a fourth source/drain diffusion region; and
  - a second gate layer formed on the second floating layer, the second gate layer electrically connected to a second word line for inducing a channel between the third source/drain diffusion region and the fourth source drain diffusion region;
- a third contact electrically connected to the third source/drain diffusion region for receiving a third select signal; and
- a fourth contact electrically connected to the fourth source/drain diffusion region for receiving a fourth select signal.

15. The mask-defined read-only memory array of claim 14, wherein the first select signal and the third select signal are the same.

16. The mask-defined read-only memory array of claim 14, wherein the second select signal and the fourth select signal are the same.

17. The mask-defined read-only memory array of claim 14, wherein the first word line and the second word line are the same.

* * * * *